(12) United States Patent
Meyer

(10) Patent No.: US 9,716,068 B2
(45) Date of Patent: Jul. 25, 2017

(54) SEMICONDUCTOR DEVICE

(71) Applicant: Infineon Technologies AG, Neubiberg (DE)

(72) Inventor: Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/170,250

(22) Filed: Jun. 1, 2016

(65) Prior Publication Data

US 2016/0276279 A1    Sep. 22, 2016

Related U.S. Application Data

(62) Division of application No. 12/326,515, filed on Dec. 2, 2008, now abandoned.

(51) Int. Cl.
*H01L 23/538*    (2006.01)
*H01L 21/48*    (2006.01)
(Continued)

(52) U.S. Cl.
CPC ........ *H01L 23/5389* (2013.01); *H01L 21/486* (2013.01); *H01L 21/4853* (2013.01); *H01L 21/565* (2013.01); *H01L 21/568* (2013.01); *H01L 21/6835* (2013.01); *H01L 23/3114* (2013.01); *H01L 23/3128* (2013.01); *H01L 23/49816* (2013.01); *H01L 23/49827* (2013.01); *H01L 23/5384* (2013.01); *H01L 23/5386* (2013.01); *H01L 24/96* (2013.01); *H01L 25/0655* (2013.01); *H01L 25/105* (2013.01);
(Continued)

(58) Field of Classification Search
CPC   H01L 23/5389; H01L 21/4853; H01L 21/486
See application file for complete search history.

(56) References Cited

U.S. PATENT DOCUMENTS 5,565,706 A    10/1996  Miura et al.
7,402,515 B2    7/2008  Arana et al.
(Continued)

FOREIGN PATENT DOCUMENTS

DE         102004022884        12/2005
DE       10 2005 043 557         9/2006
(Continued)

OTHER PUBLICATIONS

Brunnbauer, et al. "Embedded wafer level Ball Grid Array (eWLB)," 2006 Electronics Packaging Technology Conference, Copyright 2006, 5 pgs.

(Continued)

*Primary Examiner* — Latanya N Crawford
(74) *Attorney, Agent, or Firm* — Dicke, Billig & Czaja, PLLC

(57) ABSTRACT

A semiconductor device includes a semiconductor chip, an electrically insulating element separated from the semiconductor chip by a space, and encapsulation material disposed in the space. The semiconductor chip includes a first face having a contact, and the electrically insulating element defines at least one through-hole. The encapsulation material is disposed around the semiconductor chip and around the electrically insulating element. Electrically conducting material is deposited in the through-hole of the electrically insulating element and communicates with the contact.

22 Claims, 10 Drawing Sheets

(51) Int. Cl.
*H01L 21/56* (2006.01)
*H01L 21/683* (2006.01)
*H01L 23/31* (2006.01)
*H01L 23/498* (2006.01)
*H01L 23/00* (2006.01)
*H01L 25/10* (2006.01)
*H01L 25/065* (2006.01)
*H01L 25/00* (2006.01)

(52) U.S. Cl.
CPC .... *H01L 25/50* (2013.01); *H01L 2224/04105* (2013.01); *H01L 2224/20* (2013.01); *H01L 2225/1035* (2013.01); *H01L 2225/1058* (2013.01); *H01L 2924/01013* (2013.01); *H01L 2924/01029* (2013.01); *H01L 2924/01033* (2013.01); *H01L 2924/01068* (2013.01); *H01L 2924/01082* (2013.01); *H01L 2924/1305* (2013.01); *H01L 2924/13055* (2013.01); *H01L 2924/14* (2013.01); *H01L 2924/15311* (2013.01)

(56) References Cited

U.S. PATENT DOCUMENTS 7,545,047 B2  6/2009  Bauer et al.

| 2005/0009243 | A1 | 1/2005 | Taniguchi |
| 2005/0161803 | A1 | 7/2005 | Mihara |
| 2008/0079461 | A1 | 4/2008 | Lin et al. |
| 2008/0157316 | A1 | 7/2008 | Yang |
| 2008/0277776 | A1 | 11/2008 | Enomoto |
| 2008/0284035 | A1 | 11/2008 | Brunnbauer et al. |
| 2008/0290492 | A1 | 11/2008 | Chung et al. |
| 2009/0008793 | A1 | 1/2009 | Pohl et al. |
| 2009/0039523 | A1 | 2/2009 | Jiang et al. |
| 2009/0072384 | A1 | 3/2009 | Wong et al. |
| 2009/0200652 | A1 | 8/2009 | Oh et al. |
| 2010/0006330 | A1 | 1/2010 | Fu et al. |
| 2010/0233831 | A1 | 9/2010 | Pohl et al. |

FOREIGN PATENT DOCUMENTS

DE  112006001588  5/2008
JP  2007201254  8/2007

OTHER PUBLICATIONS

"Sanmina-Sci Manufacturers World's First prototype Printed circuit Board with 100 Percent Embedded ESD Protection," Sanmina-Sci Press release, San Jose, CA., Aug. 8, 2007 3 pgs.

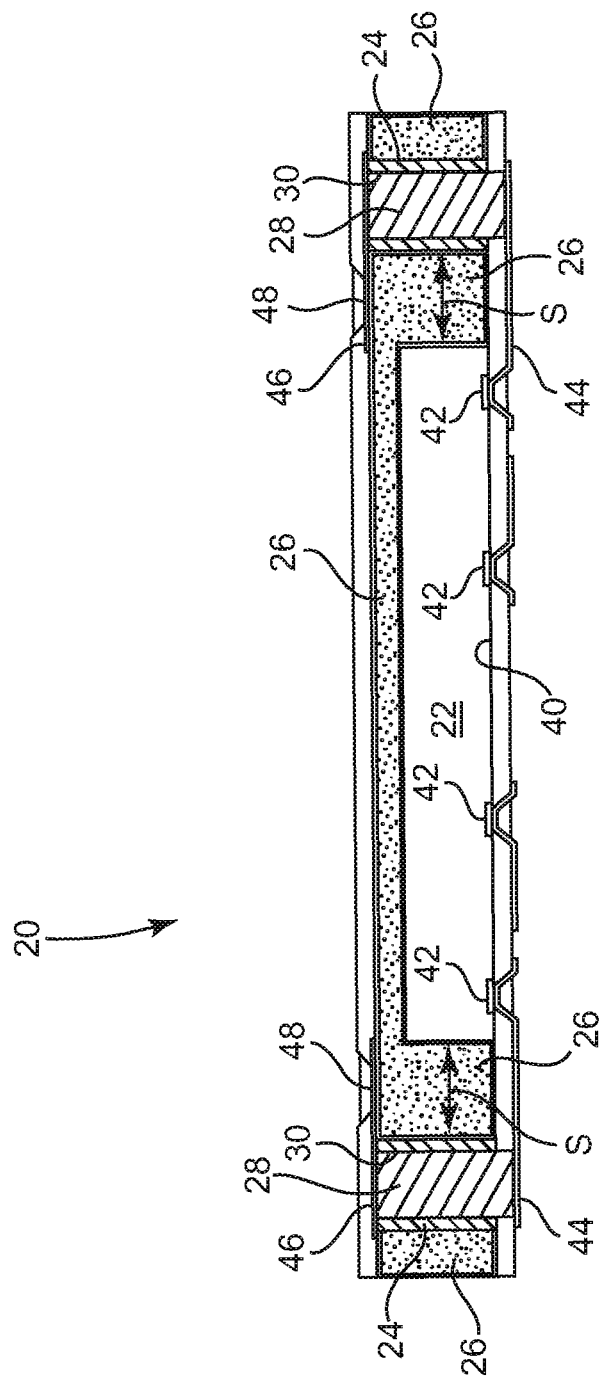

SEMICONDUCTOR DEVICE

CROSS-REFERENCE TO RELATED APPLICATIONS

This Utility Patent Application is a divisional of U.S. patent application Ser. No. 12/326,515, filed Dec. 2, 2008, which is incorporated herein by reference.

BACKGROUND

A semiconductor package provides a protective enclosure for one or more semiconductor chips and includes interconnects leading to the chip(s). Semiconductor packages have application in many electronic devices, including cellular telephones and other communication devices, automotive electronics, and other technology platforms.

Some semiconductor packages are configured to be compatible with package-on-package stacking technologies in which another component is stacked on the package. Such package-on-package stacks include a first level interconnect communicating with contacts on the semiconductor chip, and an upper level collection of landing pads that electrically connect with the first level interconnects. It is desirable to provide package-on-package semiconductor devices with a flexible interconnect geometry compatible with pick-and-place and molding processes while also having a minimal package size.

For these and other reasons there is a need for the present invention.

SUMMARY

One aspect provides a semiconductor device including a semiconductor chip, an electrically insulating element separated from the semiconductor chip by a space, and encapsulation material disposed in the space. The semiconductor chip includes a first face having a contact, and the electrically insulating element defines at least one through-hole. The encapsulation material is disposed around the semiconductor chip and around the electrically insulating element. Electrically conducting material is deposited in the through-hole of the electrically insulating element and communicates with the contact.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1B is a schematic cross-sectional view of a semiconductor device according to one embodiment.

DETAILED DESCRIPTION

Figure 1A:
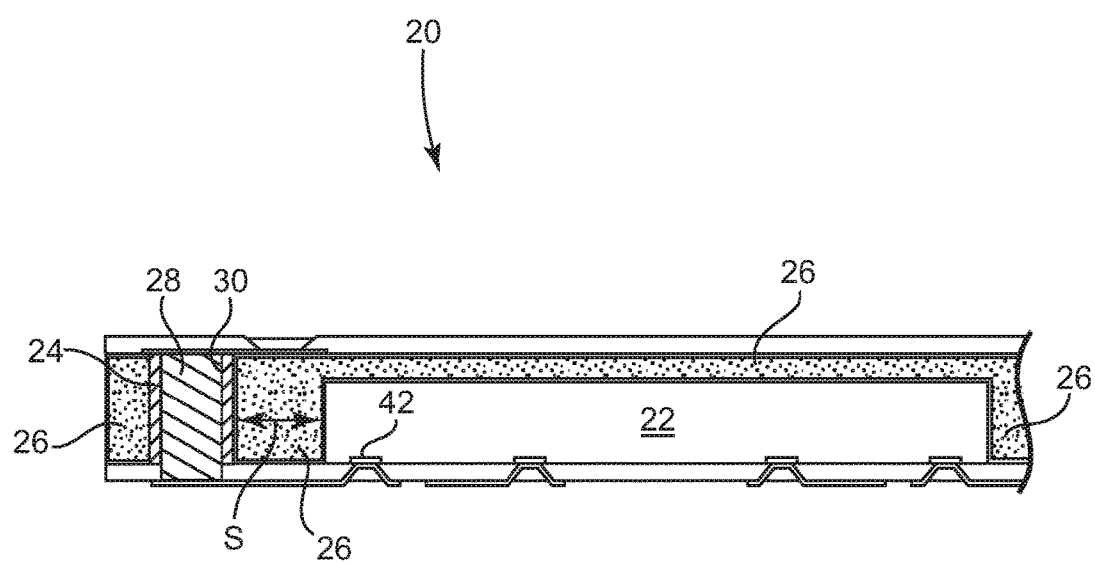
FIG. 1A is a schematic cross-sectional view of a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide an embedded wafer level semiconductor package. The semiconductor package includes one or more electrically insulating elements each having one or more through-holes, the through-holes are filled with electrically conducting material to provide the embedded semiconductor package with a wide range of flexibility for Z-directional interconnectivity to semiconductor chips in the package and components stacked on the package.

Embodiments provide relatively inexpensive electrically insulating elements that are easy to pick-and-place. In one embodiment, the electrically insulating elements are formed of an unfilled polymer that enables openings to be formed by laser drilling, mechanical boring, or otherwise opening vias in a clean, quick and efficient manner. In one embodiment, multiple electrically insulating elements are provided, where the electrically insulating elements include vias that provide broad flexibility for connecting other electronic devices to chips within the package.

Conventional semiconductor packages employ conductive bars that are placed alongside the semiconductor chips and over-molded with encapsulation material. The conventional conductive bars provide limited Z-directional connectivity with only one or a few interconnect positions and are incompatible with grouping to provide small interconnect groups. In addition, the conductive bars are relatively expensive compared to the elements provided herein, and have a relatively large aspect ratio (thickness to via diameter) that limits the miniaturization of the semiconductor package. The conventional conductive bars have the potential to shift during molding, which could introduce additional process steps for repairing the package before final assembly.

Other conventional semiconductor devices provide Z-directional connectivity by laser drilling one or more vias through the encapsulation material and filling the vias with electrically conductive material. However, drilling a via in the filled encapsulation material is time consuming and expensive. In addition, vias formed in the filled encapsulation material do not provide straight walled through-holes and include undercuts that can make filling the vias difficult. Improperly filled vias or vias with undercuts can have less than desirable electrical properties.

FIG. 1A is a schematic cross-sectional view of a semiconductor device 20 according to one embodiment. Semiconductor device 20 includes a semiconductor chip 22, an electrically insulating element 24 separated from chip 22 by a space S, encapsulation material 26 disposed in the space S and around chip 22 and around electrically insulating element 24, and electrically conducting material 28 deposited in a through-hole 30 formed in the electrically insulating element 24. The electrically conducting material 28 communicates with at least one contact 42 of chip 22.

In one embodiment, one or more electrically insulating elements 24 are disposed a distance S away from one or more chips 22, where each electrically insulating element 24 includes one or more through-holes 30. In this manner, electrically insulating elements 24 are configured for convenient pick-and-place positioning and provide ample area for via openings. The electrically insulating elements 24, when vias 30 are filled with conducting material 28, provide flexibility for connecting other electronic devices to chips within the package.

FIG. 1B is a schematic cross-sectional view of semiconductor device 20. In one embodiment, chip 22 includes a first face 40 (or active surface 40) having contacts 42, and device 20 includes an electrically conducting trace 44 (or a redistribution layer 44) electrically connected between contacts 42 and electrically conducting material 28. In one embodiment, another electrically conducting trace 46 (or second redistribution layer 46) is electrically connected to electrically conducting material 28 to form a landing pad 48. Traces 44, 46 are deposited by suitable deposition processes, including chemical vapor deposition and/or other direct deposition processes. Z-directional connectivity through semiconductor device 20 is established through landing pad 48 across trace 46, through electrically conducting material 28, across trace 44 to contact 42 of chip 22.

Figure 2:
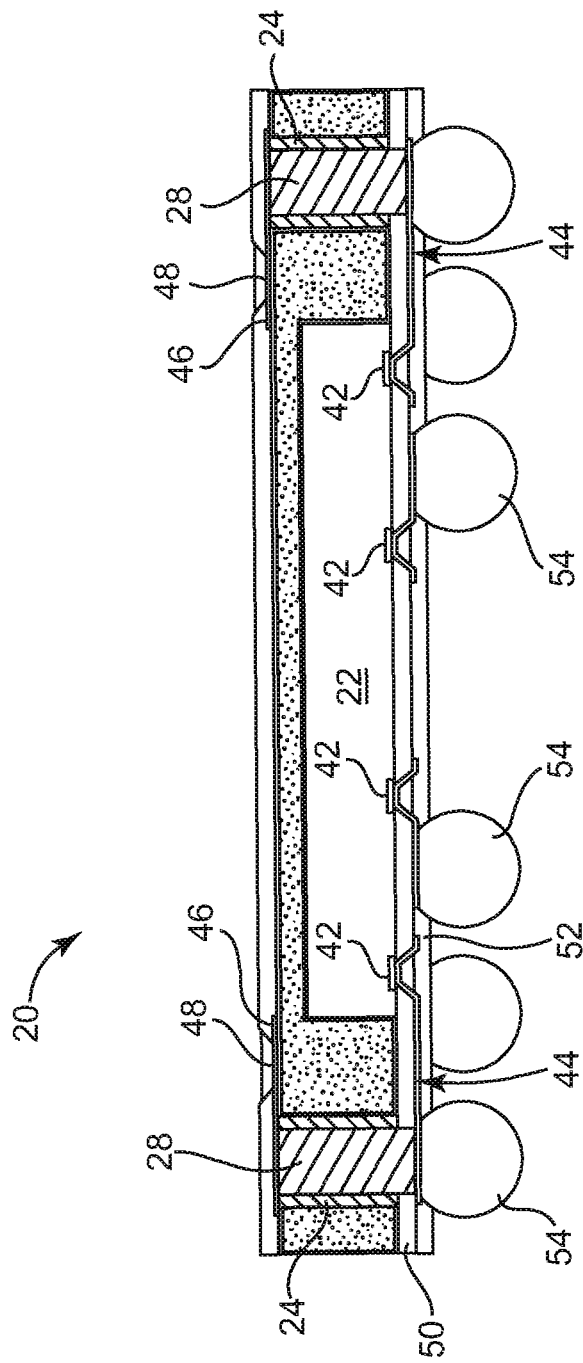
FIG. 2 is a schematic cross-sectional view of a semiconductor package configured for package-on-package stacking according to one embodiment.

FIG. 2 is a schematic cross-sectional view of semiconductor device 20 including solder balls 54. In one embodiment, RDL 44 is structured in dielectric 50 that is provided with a solder stop 52 deposited across a surface of dielectric 50 and configured for receiving solder balls 54. In one embodiment, RDL 44, 46 are structured into dielectric 50 through an embedded wafer level process or other suitable process. Suitable processes for structuring dielectric 50 include photolithography, etching, and other discrete material removal processes. The solder balls 54 enable device 20 to be electrically connected to printed circuit boards or other devices. The landing pads 48 configure semiconductor device 20 for package-on-package stacking. For example, other electronic components connected to landing pads 48 electrically communicate with contacts 42 on chip 22 through RDL 46, electrically conducting material 28, and RDL 44.

Figure 3:
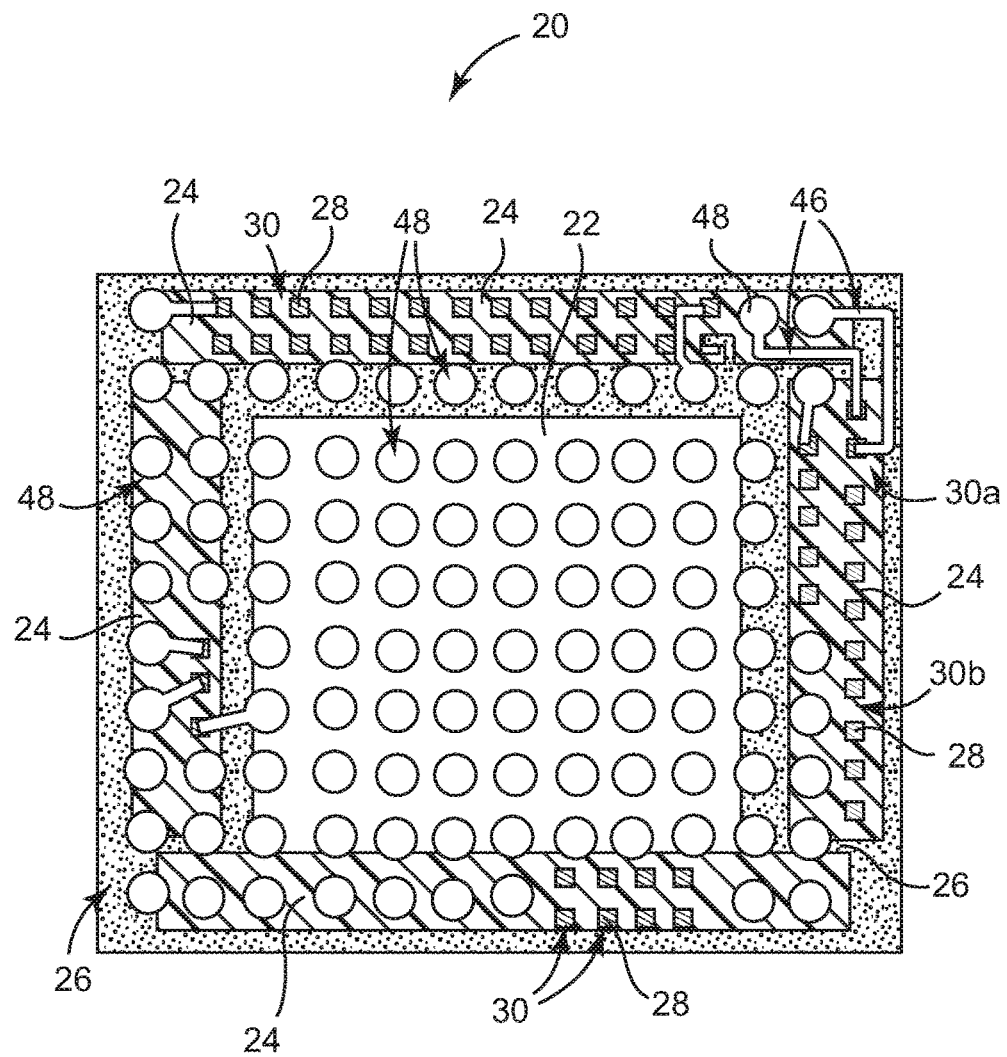
FIG. 3 is a top view of the semiconductor package illustrated in FIG. 2.

FIG. 3 is a top view of semiconductor device 20. In one embodiment, multiple electrically insulating elements 24 are provided spaced apart from chip 22. In the embodiment illustrated, four electrically insulating elements 24 are provided spaced apart from chip 22, although other numbers of elements 24 are also acceptable. In one embodiment, each of the electrically insulating elements 24 include multiple through-holes 30 filled with electrically conducting material 28, although it is acceptable that not all through-holes 30 are utilized. For example, and with reference to the right hand side of FIG. 3, vias 30b are available (although not connected) for electrical connection to chip 22, and vias 30a are electrically connected to RDL 46 and landing pads 48.

Semiconductor device 20 provides increased flexibility in selectively locating connections between landing pads 48 and vias 30a for attachment to chip 22. The filled vias 30 are suitably located anywhere along electrically insulating elements 24 to provide for interconnecting small groups or custom placement of other electronic devices on landing pads 48. In addition, the electrically insulating elements 24 are stable and enable compression molding of encapsulation material 26 around elements 24.

Semiconductor chips 22 include integrated circuits suitably configured as logic circuits, control circuits, microprocessors, or microelectrical-mechanical components. In one embodiment, chips 22 include power semiconductor chips such as power transistors or insulated gate bipolar transistors (IGBT). In one embodiment, chips 22 include a vertical structure (a Z-directional structure) configured such that electric current flows in the Z-direction perpendicular to the major surfaces of semiconductor device 20. In one embodiment, suitable semiconductor chips 22 are provided with a Z-direction topography and include chips 22 with contacts 42 on active surface 40 (FIG. 1B).

In one embodiment, electrically insulating elements 24 are fabricated from polymer, such as a thermoplastic. In one embodiment, electrically insulating elements 24 are fabricated from epoxy. In one embodiment, electrically insulating elements 24 have a height of between approximately 100-500 micrometers and a width of between approximately 50-250 micrometers, although other sizes are acceptable.

In one embodiment, encapsulation material 26 is a filled material, for example a polymer filled with silicon, and electrically insulating elements 24 are unfilled and configured for formation of vias 30 without undercuts.

In one embodiment, electrically conductive material 28 includes copper, alloys of copper, aluminum, alloys of aluminum, or layers of electrically conducting materials such as metals.

Figure 4:
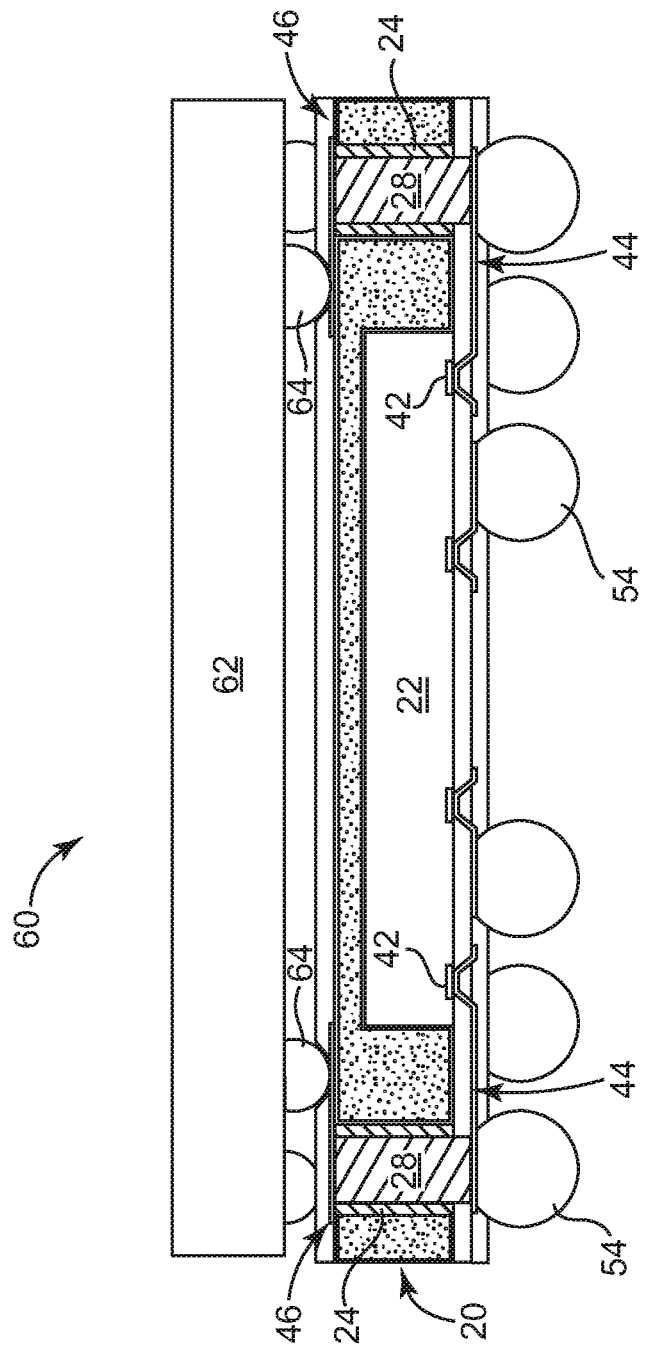
FIG. 4 is a schematic cross-sectional view of an electronic component connected to the semiconductor package illustrated in FIG. 2 according to one embodiment.

FIG. 4 is a schematic cross-sectional view of a package-on-package device 60 according to one embodiment. Package-on-package device 60 (POP device 60) includes a separate electronic component 62 or device 62 electrically connected to semiconductor device 20 by balls 64. As described above, chip 22 is embedded within encapsulation material 26 and is considered an embedded device, such that POP device 60 is considered an embedded package-on-package (ePOP) device 60.

In one embodiment, chip 22 is provided as a logic chip and separate electronic device 62 is provided as a memory device such that ePOP 60 is provided as a stacked logic and memory device. In one embodiment, chip 22 includes several hundred input/output locations that are accessible by vias 30 (see FIG. 3) and connectable by landing pads 48. Device 62 is placed on a portion of the pads 48.

Suitable electronic devices 62 include memory available from, for example, Samsung or Qimonda or another fabricator of memory devices. When connected in a stack, electronic device 62 is electrically connected to RDL 46 by ball 64, and communicates with contacts 42 on chip 22 through RDL 44 and electrically conducting material 28.

Figure 5:
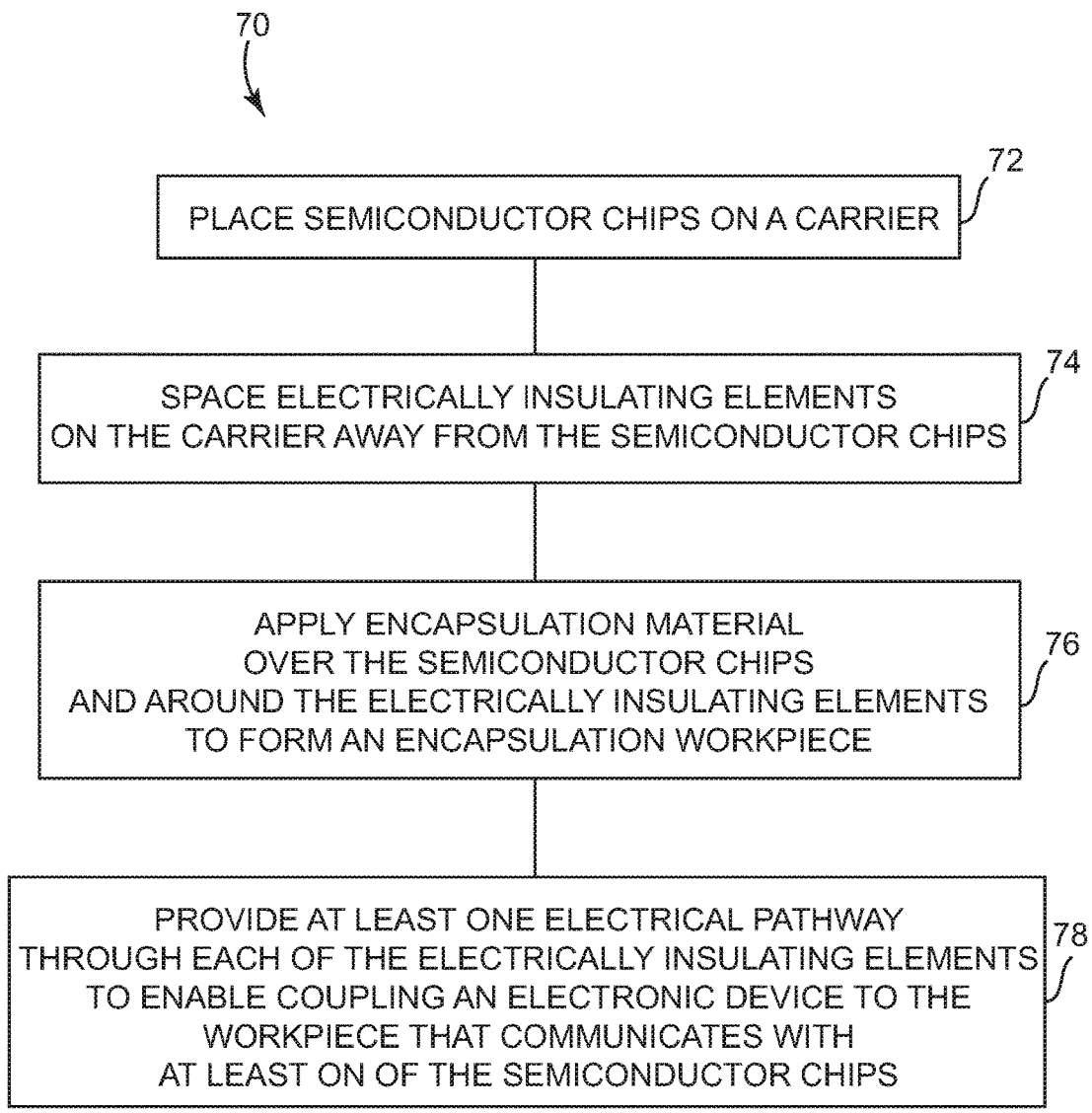
FIG. 5 is a block diagram of a process for fabricating a semiconductor package according to one embodiment.

FIG. 5 is a block diagram 70 of a process for assembling semiconductor device 20 according to one embodiment. In one exemplary process, semiconductor chips are placed on a carrier at 72. At 74, electrically insulating elements are spaced on the carrier away from the semiconductor chips. At 76, encapsulation material is applied over the semiconductor chips and around the electrically insulating elements to form an encapsulation workpiece. At 78, at least one electrical pathway is provided through each of the electrically insulating elements to enable coupling an electronic device to the workpiece that communicates with at least one of the semiconductor chips.

It is acceptable to apply encapsulation material over the semiconductor chips and over the electrically insulating elements, although it is preferable to minimize the thickness of the encapsulation material over the electrically insulating elements to minimize or eliminate undercuts that are formed when boring through the encapsulation material.

FIGS. 6A-6I provide schematic cross-sectional views of the fabrication of semiconductor devices 20 according to one embodiment.

Figure 6A:
FIGS. 6A-6I are schematic cross-sectional views of a process for assembling semiconductor devices according to one embodiment.

FIG. 6A is a cross-sectional view of a carrier 80. Suitable carriers include metal carriers, silicon carriers, or polymer carriers.

Figure 6B:
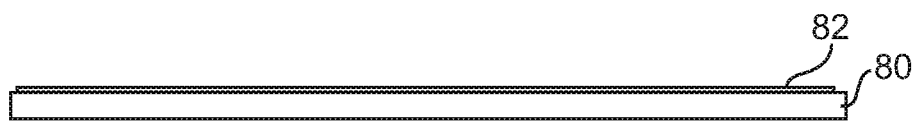

FIG. 6B is a cross-sectional view of an adhesive foil 82 attached to carrier 80. In one embodiment, adhesive foil 82 is provided as a double-sided adhesive that is releasably attached to carrier 80.

Figure 6C:
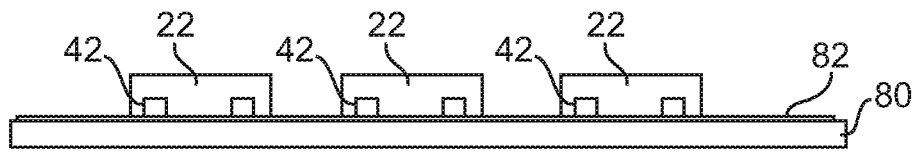

FIG. 6C is a cross-sectional view of semiconductor chips 22 attached to adhesive foil 82 and carrier 80. In one embodiment, active surface 40 (FIG. 1B) is connected to adhesive foil 82 such that contacts 42 are oriented down on carrier 80. In one embodiment, chips 22 are picked-and-placed onto carrier 80 employing a suitable pick-and-place process as employed in semiconductor fabrication.

Figure 6D:
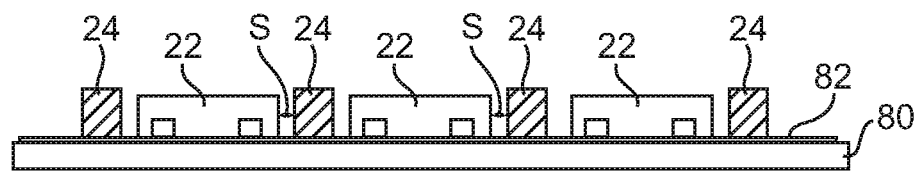

FIG. 6D is a cross-sectional view of electrically insulating elements 24 placed on carrier 80 and spaced apart by the distance S from chips 22. In one embodiment, a lateral dimension of the electrically insulating elements 24 is between about 100-1000 micrometers such that elements 24 are easily picked and placed by standard pick-and-place equipment.

Figure 6E:
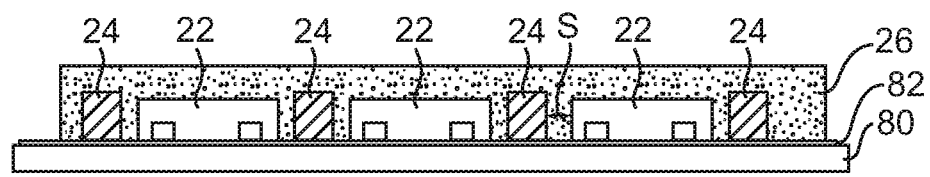

FIG. 6E is a cross-sectional view of encapsulation material 26 deposited over chips 22, around chips 22, and around elements 24. Suitable encapsulation material 26 includes plastic or epoxy encapsulation material that is either filled or unfilled with silicon. For example, in one embodiment encapsulation material 26 is a silicon-filled polymer suitably molded over chips 22 and into space S. Suitable encapsulation processes include compression molding or injection molding.

Figure 6F:
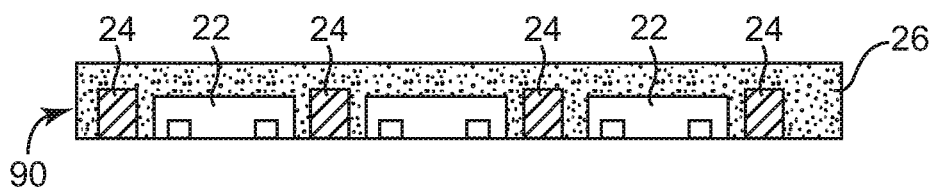

FIG. 6F is a cross-sectional view of workpiece 90 (or encapsulation body 90) including chips 22 and elements 24 encapsulated in encapsulation material 26 and removed from carrier 80 (FIG. 6C) and adhesive foil 82.

Figure 6G:
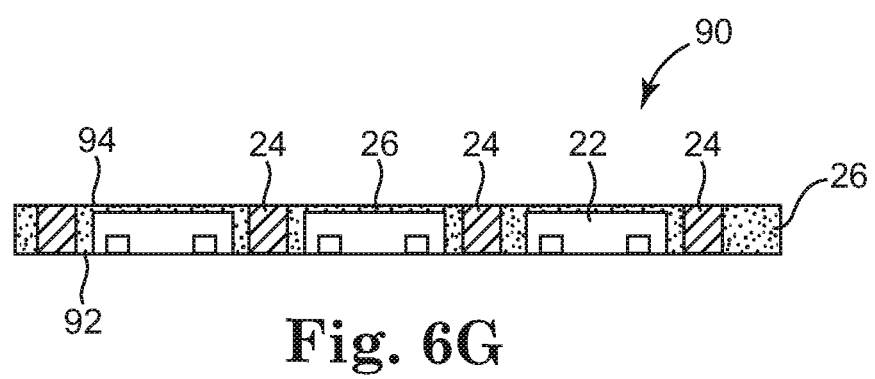

FIG. 6G is a cross-sectional view of workpiece 90 or encapsulation body 90 having a first face 92 opposite a second face 94. In one embodiment, first face 92 was attached to carrier 80 by adhesive 82 and second face 94 has been planarized (for example by grinding or by etching) to expose a top surface of elements 24. In one embodiment, workpiece 90 is grinded to expose the top surface of element 24 and leave behind a small layer of encapsulation material 26 on top of chip 22 (as shown). In one embodiment, workpiece 90 is grinded to leave behind a thin layer of encapsulation material 26 on the top surface of element 24.

Figure 6H:
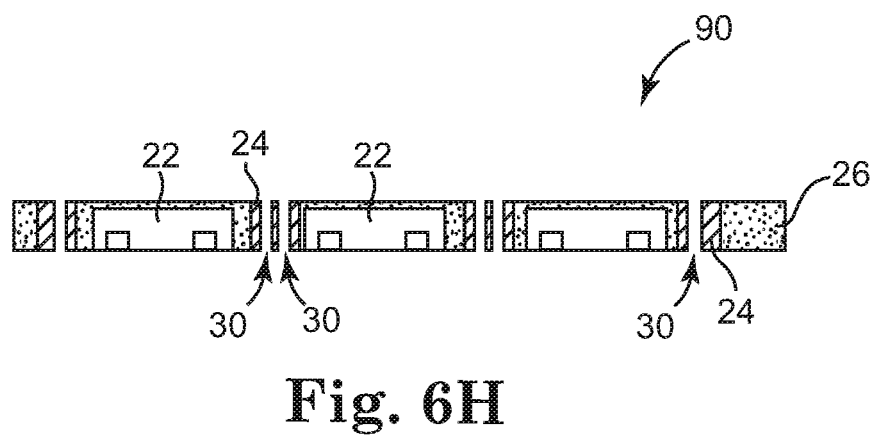

FIG. 6H is a cross-sectional view of vias 30 or through-holes 30 formed in electrically insulating elements 24. In one embodiment, the through-holes 30 include straight channel cylindrical through-holes. In one embodiment, the through-holes 30 include conical holes or holes of other geometric cross-sectional shape.

Suitable processes for forming through-holes 30 include illuminating elements 24 with a light source (i.e., photolithographic processes), or laser drilling, or mechanical drilling, or etching vias 30 in the electrically insulating material elements 24.

Figure 6I:
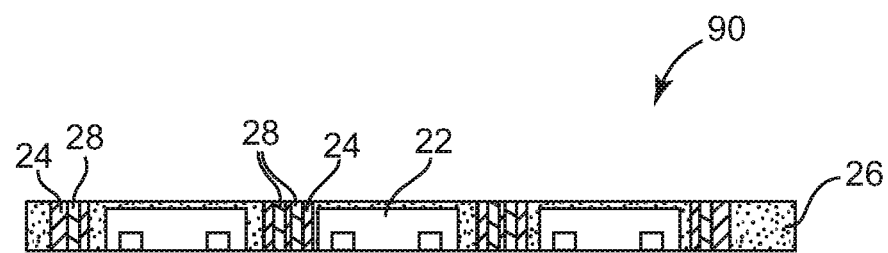

FIG. 6I is a cross sectional view of workpiece 90 including electrically conducting material 28 filled into the through-holes 30 (6H) formed in elements 24. Suitable electrically conducting material includes metal in general, and in particular, copper and alloys of copper.

Figure 7:
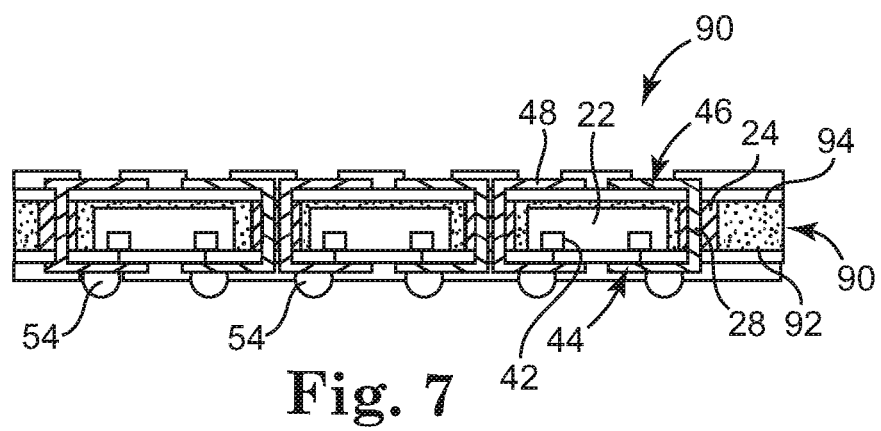
FIG. 7 is a schematic cross-sectional view of a semiconductor device including multiple encapsulated semiconductor chips according to one embodiment.

FIG. 7 is a cross-sectional view of workpiece 90 including upper and lower redistribution layers (RDL) 44, 46 or electrical traces 44, 46. In one embodiment, RDL 44 provides a first electrical trace that is structured on first face 92 of workpiece 90, and RDL 46 provides a second electrical trace structured on second face 94 of workpiece 90. RDL 44, 46 provide electrically conducting traces connected with electrically conducting material 28 that enables electrical communication between landing pads 48 and contacts 42 of chip 22. Solder balls 54 configure the embedded package illustrated in FIG. 7 for electrical connection to circuit boards, and RDL 48 and landing pads 48 configure the embedded package for stacking with other electronic devices to form an embedded package-on-package structure.

In one embodiment, the embedded chips 22 are separated from workpiece 90 by appropriately singulating workpiece 90 into multiple separate packages. For example, in one embodiment electrically insulating element 24 is separated by sawing between vias 30 formed in elements 24 to separate packages of workpiece 90.

Aspects described herein provide relatively inexpensive electrically insulating elements that are easy to pick-and-place and have openings or vias that are filled with conducting material to provide broad flexibility for connecting other electronic devices to chips within the package. Aspects described herein provide an embedded wafer level semiconductor package including one or more electrically insulating elements each having one or more through-holes that are filled with electrically conducting material to provide the embedded semiconductor package with a wide range of flexibility for Z-directional interconnectivity to semiconductor chips in the package and components stacked on the package.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of embedded package-on-package semiconductor devices, as discussed herein. Therefore, it is intended that this invention be limited only by the claims and the equivalents thereof.

What is claimed is:
1. A method of assembling a semiconductor device comprising:
   placing at least two semiconductor chips on a carrier;
   placing at least two electrically insulating material elements on the carrier;
   applying encapsulation material over the at least two semiconductor chips and the at least two electrically insulating material elements to form an encapsulation workpiece;

generating at least one through-hole through each of the electrically insulating material elements; and filling the at least one through-holes with an electrically conducting material; and removing the carrier from the encapsulation workpiece.

2. The method of claim 1, wherein the at least two semiconductor chips have a main face comprising contact elements, the at least two semiconductor chips placed on the carrier with the contact elements facing the carrier.

3. The method of claim 1, further comprising:
removing encapsulation material by one of grinding and etching a backside of the workpiece preparatory to opening the electrically insulating material elements.

4. The method of claim 1, wherein generating at least one through-hole comprises one of illuminating with a light source, laser drilling, mechanically drilling, and etching each of the electrically insulating material elements.

5. The method of claim 1, further comprising:
applying a first electrically conducting layer over a first main face of the encapsulation workpiece.

6. The method of claim 5, comprising connecting the first electrically conducting layer between the electrically conducting material in the through-holes and contact elements of the semiconductor chips.

7. The method of claim 5, further comprising:
applying external contact elements to the first electrically conducting layer.

8. The method of claim 5, further comprising:
applying a second electrically conducting layer connected over a second main face of the encapsulation workpiece opposite the first main face.

9. The method of claim 8, comprising connecting the second electrically conducting layer to the electrically conducting material in the through-holes.

10. A method of fabricating a semiconductor package comprising:
placing semiconductor chips on a carrier;
placing electrically insulating elements on the carrier spaced apart from the semiconductor chips;
applying encapsulation material over the semiconductor chips and around the electrically insulating elements to form an encapsulation workpiece; and
providing at least one electrical pathway through each of the electrically insulating elements, after the electrically insulating elements have been placed on the carrier, to enable coupling an electronic device to the workpiece that communicates with at least one of the semiconductor chips by:
generating at least one through-hole through each of the electrically insulating elements; and
filling each through-hole with an electrically conducting material.

11. The method of claim 10, comprising applying an electrically conducting layer over at least one main face of the encapsulation workpiece and in contact with the electrically conducting material.

12. The method of claim 11, comprising applying a first electrically conducting layer over a first main face of the encapsulation workpiece and a second electrically conducting layer over a second main face of the encapsulation workpiece, the first and second electrically conducting layers in contact with the electrically conducting material.

13. The method of claim 12, wherein the electronic device comprises a memory device connected to the second electrically conducting layer.

14. A method of fabricating a semiconductor device comprising:

placing a semiconductor chip on a major surface of a carrier;
placing at least one preformed electrically insulating element on the major surface of the carrier at a selected distance from a perimeter side of the semiconductor chip;
embedding the semiconductor chip and the at least one preformed electrically insulating element in encapsulation material; and
planarizing the encapsulation material to expose a surface of the at least one preformed electrically insulating element.

15. The method of claim 14, wherein the electrically insulating element comprises a first material and the encapsulating material comprises a second material.

16. The method of claim 15, wherein the first material comprises an unfilled polymer.

17. The method of claim 15, wherein the first material is the same as the second material.

18. The method of claim 14, wherein the at least one electrically insulating element is placed using a pick-and-place process.

19. A method of fabricating a semiconductor device comprising:
placing a semiconductor chip on a major surface of a carrier;
placing at least one preformed electrically insulating element on the major surface of the carrier at a selected distance from a perimeter side of the semiconductor chip; and
embedding the semiconductor chip and the at least one preformed electrically insulating element in encapsulation material, wherein the at least one preformed electrically insulating element and the encapsulating material each have a first surface facing the major surface of the carrier and each have second surface opposite the first surface, the method including planarizing the second surface of the encapsulation material and the second surface of the at least one preformed electrically insulating element so that together the second surface of the encapsulating material and the second surface of the at least one preformed electrically insulating element form a coplanar surface.

20. The method of claim 19, wherein the at least one electrically insulating element, after planarization, has a thickness, as measured from the first surface to the second surface, that is greater than a thickness of the semiconductor chip.

21. The method of claim 19, including:
removing the carrier;
forming one or more through holes through the at least one preformed electrically insulating element; and
filling the one or more through holes with an electrically conductive material to form one or more electrically conductive vias through the electrically insulating element.

22. The method of claim 21, including
forming an upper redistribution layer on the coplanar surface; and
forming a lower redistribution layer on a coplanar surface together formed by the first surface of the at least one electrically conductive element, the first surface of the encapsulating material, and an active surface of the semiconductor chip, the upper and lower redistribution layers electrically connected by the one or more electrically conductive vias.

* * * * *